(12) United States Patent
Teggatz et al.

(10) Patent No.: US 8,102,713 B2
(45) Date of Patent: Jan. 24, 2012

(54) NON-VOLATILE MEMORY MONITOR

(75) Inventors: Ross E. Teggatz, Richardson, TX (US); Wayne T. Chen, Plano, TX (US); Brett Smith, McKinney, TX (US)

(73) Assignee: Triune IP LLC, Richardson, TX (US)

( * ) Notice: Subject to any disclaimer, the term of this patent is extended or adjusted under 35 U.S.C. 154(b) by 471 days.

(21) Appl. No.: 12/492,091

(22) Filed: Jun. 25, 2009

(65) Prior Publication Data

US 2010/0027343 A1 Feb. 4, 2010

Related U.S. Application Data

(60) Provisional application No. 61/086,077, filed on Aug. 4, 2008.

(51) Int. Cl.
*G11C 16/04* (2006.01)

(52) U.S. Cl. ............ 365/185.18; 365/185.01; 365/185.2; 365/189.07; 365/210.1

(58) Field of Classification Search .............. 365/185.18, 365/185.01, 185.2, 189.07, 210.1
See application file for complete search history.

(56) References Cited

U.S. PATENT DOCUMENTS

2002/0024844 A1* 2/2002 Saeki ..................... 365/185.22
2007/0263437 A1* 11/2007 Chen ....................... 365/185.2

* cited by examiner

*Primary Examiner* — Tuan T Nguyen
*Assistant Examiner* — Toan Le
(74) *Attorney, Agent, or Firm* — Michael T. Konczal; Konczal Law Firm PLLC

(57) ABSTRACT

The invention provides circuits, systems, and methods for monitoring a non-volatile memory (NVM) cell, or an array of NVM cells. The monitor is capable of switching from a normal operating state to an evaluation state, monitoring for one or more particular characteristics, and returning to the normal operating state. Alternative embodiments of the invention are disclosed using various triggers and producing outputs capable of reporting or feeding back to influence the operation of the monitoring systems and methods, the NVM circuitry, or an external system. The invention includes an energy conservation feature, in that no power is consumed in the normal operating state, and low power in the evaluation state.

31 Claims, 2 Drawing Sheets

NON-VOLATILE MEMORY MONITOR

PRIORITY ENTITLEMENT

This application is entitled to priority based on Provisional Patent Application Ser. No. 61/086,077 filed on Aug. 4, 2008, which is incorporated herein for all purposes by this reference. This application and the Provisional patent application have at least one common inventor.

TECHNICAL FIELD

The invention relates to low-current analog integrated circuitry. More particularly, the invention relates to microelectronic floating gate circuit architectures, systems, and methods for their monitoring, programming, verification, and operation.

BACKGROUND OF THE INVENTION

A floating gate transistor typically includes a control gate and a floating gate, such that, when provided an electrical charge through channel-hot-carrier (CHC) electron injection or Fowler-Nordheim tunneling, for example, the charge is retained on the floating gate due to isolation by a surrounding insulating oxide. Floating gate transistors are capable of storing an electrical charge for extended periods of time without requiring additional power input. Floating gate transistors are commonly used in non-volatile memory (NVM) devices, such as flash memory, erasable programmable read-only memory (EPROM), and electrically erasable programmable read-only memory (EEPROM).

Each non-volatile memory integrated circuit generally includes an array of memory cells and logic for reading the stored information, which may be digital, or multi-level. Many non-volatile memory devices are programmable and/or erasable, and thus also include logic for performing program and erase functions. Flash EEPROMs, for example, are capable of electrically programming and reading individual cells in an array and are also capable of erasing the entire memory cell array simultaneously.

Once programmed, a floating gate NVM cell maintains the data programmed for long periods of time in power-off as well as power-on states. Despite its name, however, the non-volatile memory cell is not perfectly non-volatile in nature. In theory, a floating gate programmed at a particular charge level would remain at that level permanently, since the floating gate is insulated by the surrounding material. In reality, a decay of the charge occurs over time due to various factors, including the gradual escape of electrons from the gate. The decay of charge is not entirely predictable. It can be influenced by environmental factors such as mechanical and thermal stress effects or other variables. Given enough time, the decay will eventually return the floating gate to an electrically balanced state. Even partial charge decay may result in erasure or corruption of the data stored in the NVM cell. Additionally, as the electrons leak from the floating gate, the threshold voltage of the NVM cell gradually decreases, which may eventually allow a current flow sufficient to inadvertently turn a programmed cell on when a read voltage is applied. In addition to the gradual decay of charge on the floating gate, programming is also sometimes hampered by an initial loss of charge shortly after programming. Such charge shifts may be caused by material defects or unintended charge transfer due to circuit geometry.

The term "retention" is used to refer to the integrity of the stored non-volatile memory data as a function of time. Constant monitoring in order to verify retention is not only inefficient, but contradictory to the purpose of NVM, which is designed for data storage absent ongoing power input. Another approach for addressing the problem, simply assuming retention and not monitoring or refreshing the NVM, is sometimes used, but this approach is not desirable in applications where either accuracy or reliability are highly important, particularly automotive, medical, and military markets, for example. One of the problems with traditional voltage references is that in order to maintain a relatively constant voltage over time, the circuit requires a continuous draw of current, which is a disadvantage for low-power systems. The voltage reference can be replaced with a floating gate voltage reference, but the voltage gate reference or sample and hold may drift over time, thus requiring refreshing the voltage or sample and hold value. A problem with refresh schemes that rely solely on timer triggers is that retention may be adversely affected by events other than the passage of time. Operating conditions, such as temperature or radiation exposure, for example, may diminish retention by stimulating electron migration or by causing changes in characteristics of the circuit that permanently affect subsequent retention. A timed approach to ensuring NVM retention by periodically refreshing memory does not react to changing operating conditions.

Due to these and other problems and potential problems with the current state of the art, improved floating gate monitoring circuits and methods would be useful and advantageous.

SUMMARY OF THE INVENTION

In carrying out the principles of the present invention, in accordance with preferred embodiments, the invention provides advances in the arts with novel methods and apparatus directed to providing efficient non-volatile memory monitoring, which may be used for reporting, adjusting, protecting, or otherwise improving the operation of non-volatile memory circuits and any associated systems.

According to one aspect of the invention, a preferred embodiment includes method steps for monitoring a non-volatile memory circuit by switching a monitor from a normal operating state to an evaluation state in order to monitor at least one electrical characteristic of one or more non-volatile memory devices. An output signal is produced based on evaluation of the monitored characteristics, and the monitor is switched from an evaluation state to a power-saving normal operating state.

According to additional aspects of the invention, examples of preferred embodiments include various steps for triggering the switching of monitoring methods and systems between evaluation and normal operating states.

According to another aspect of the invention, a preferred embodiment may include steps for providing an output signal in the form of an indication of the state of one or more monitored elements, such as a non-volatile memory cell.

According to yet another aspect of the invention, a preferred embodiment includes steps for providing an output signal in the form of analog indication of a value relating to one or more monitored elements, such as a non-volatile memory cell.

According to further aspects of the invention, preferred embodiments include steps for producing one or more feedback signals for influencing one or more characteristics of the monitoring system, and/or for influencing the monitored circuit or an associated host system.

According to still another aspect of the invention, a system for monitoring a non-volatile memory circuit has an evaluation module for reading one or more non-volatile memory cells, relating the reading to a reference, and providing an evaluation signal to a control module. The control module is configured for providing one or more output signals based on the evaluation signal. The output signals may take the form of state or value reporting, or feedback into one or more parts of the system.

The invention has advantages including but not limited to providing one or more of the following features; improved monitoring of non-volatile memory (NVM) cells, improved NVM circuit accuracy, rapid programming, and improved stability over a range of operating conditions. The invention is further advantageous in that it is designed to require low power to operate, and is relatively easy to manufacture. These and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as right, left, back, top, bottom, upper, side, et cetera, refer to the drawings themselves as laid out on the paper and not to physical limitations of the invention unless specifically noted. The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with various electronic circuits, microelectronic circuit components, systems, system components, and subsystems without altering the principles of the invention. For purposes of clarity, detailed descriptions of functions, components, and systems familiar to those skilled in the applicable arts are not included. In general, the invention provides low-power non-volatile memory (NVM) monitoring circuits, systems, and methods for the improvement of non-volatile memory in a variety of applications and systems.

In implementing preferred embodiments of the present invention, one or more non-volatile memory (NVM) monitoring circuits or components may be utilized, either integrated into a non-volatile memory device or system component, or provided externally for association with a non-volatile memory system. The monitoring functions may include means for reporting monitored states or values. Other monitoring functions may preferably be provided, including means for adjusting non-volatile memory (NVM) cell values, compensating, calibrating, or protecting, NVM cells, arrays of NVM cells, associated circuitry, or other portions of monitored devices, circuits, and systems. Low power consumption is a feature of preferred embodiments of the invention. Low power usage is preferably realized primarily by placing the monitoring circuitry in a power-off state when not actively monitoring, its "normal" state the majority of the time, and using a relatively small amount of power when in an evaluation state, actively monitoring the NVM, which is generally a small fraction of the time.

Figure 1:
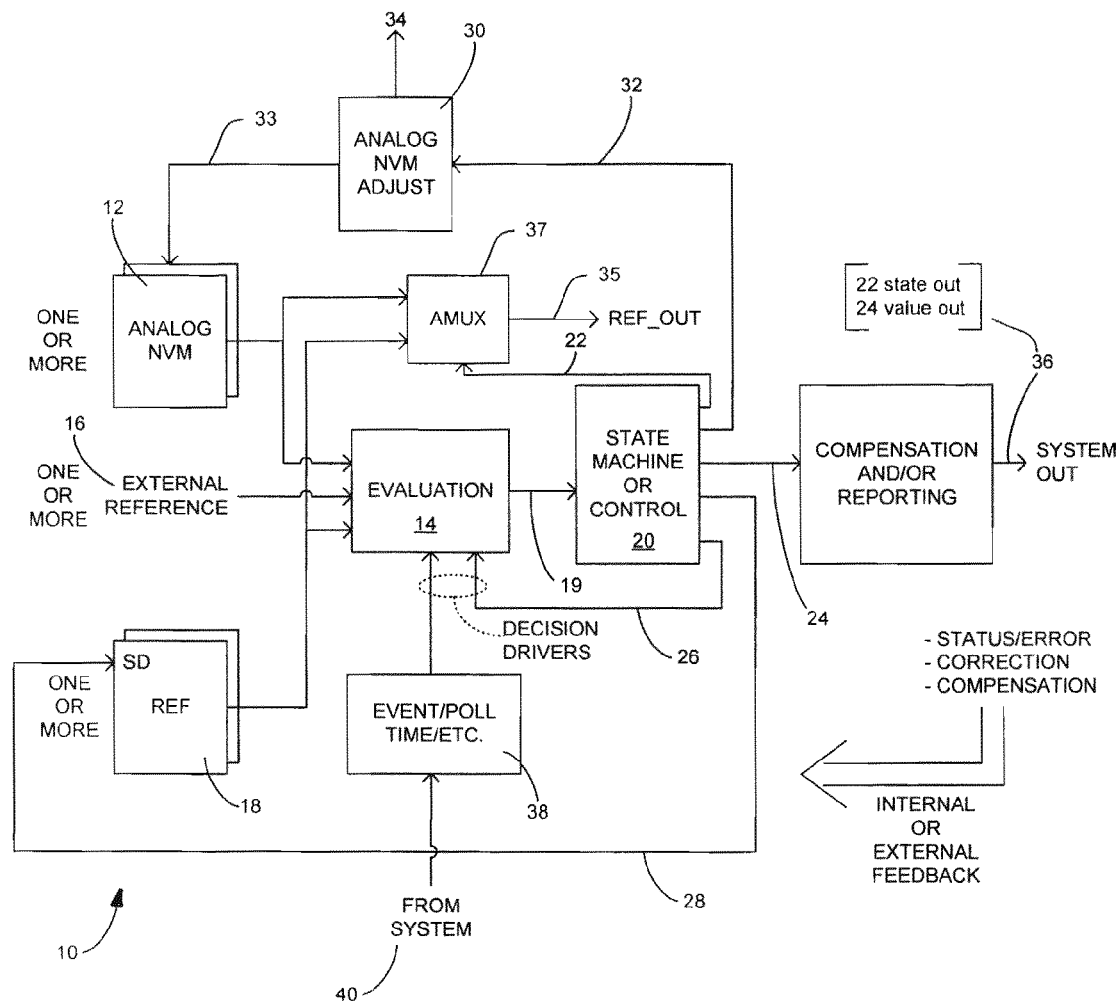
FIG. 1 is a simplified schematic diagram depicting an example of preferred embodiments of non-volatile memory (NVM) monitoring circuits, systems, and methods.

Referring primarily to FIG. 1, a block diagram illustrates examples of preferred embodiments of NVM monitoring circuits, systems, and methods. The system 10 shown includes one or more non-volatile memory cell 12 electrically coupled to an evaluation module 14. Preferably, the NVM cells are floating gates arranged in a memory array. The NVM cells may be capable of multi-level or digital data storage. The NVM represented by cell 12 may typically include arrays of numerous NVM cells without departure from the invention. The singular cell 12 is referred to herein for the convenience of avoiding repetition in the description, and not for exclusion. The evaluation module 14 is preferably configured to monitor one or more NVM cell 12 when in an evaluation state, and to consume no power when in a normal operating state. The evaluation module 14 may be configured to use one or more external references 16 for comparison with the monitored non-volatile memory (NVM) 12, or to use one or more references from within the NVM 12. The external references 16 may be drawn from an external host system (not shown) with which the monitoring system 10 may be associated. Internal references 18 independent from the monitored NVM cells 12 may also be used. Preferably, when the monitoring system 10 is in a normal operating state, internal references 18 do not consume any power. For example, floating gate references may be used, requiring no power input after programming. Alternatively, a reference such as a band gap reference may be used, wherein the monitoring system, upon entering the evaluation state, controls the supply of power to the reference as needed, discontinuing power to the reference when re-entering the normal state. The evaluation module 14 may provide monitoring functionality, according to the particular context within which the invention is practiced, for evaluating virtually any characteristic which may be measured in a circuit or system. For example, parameters such as voltage, current, power, impedance, time constant, and so forth may be evaluated. An evaluation signal 19 is preferably produced, the evaluation signal bearing a relationship to the measured parameter. The evaluation module 14 is coupled to a state machine or control module 20.

The control module 20 is equipped to accept an evaluation signal 19 input from the evaluation module 14 and preferably to manipulate and make use of it in one or more of the following ways. The control module 20 may provide a status output, shown by path 22, preferably indicative of the state, e.g., valid/invalid, of the monitored NVM cell 12. The control module 20 may also provide an output representative of a value from the monitored NVM cell 12, as shown by path 24. The control module 20 may also be used to provide feedback 26 to the evaluation module 14, in the form of one or more digital or analog signals useful for controlling the operation of the evaluation module 14. For example, the evaluation module 14 may include preprogrammed instructions related to evaluation scheduling, parameters, or methods, based upon signals, e.g. 26, received from the control module 20. Additionally, control module 20 output, as represented by path 28, may be used to provide, or to influence, a reference 18 in response to a signal from the control module 20.

In preferred embodiments of the invention, an analog adjusting module 30 may be provided for adjusting the charge stored in the NVM cell 12. As indicated by path 32, the control module 20 preferably provides a signal for influencing the adjusting module 30, indicating a suitable charge level for a particular NVM cell 12, for example. As shown by arrow path 33, the analog adjusting module 30 may be used to provide a signal, as determined by the control module 20, to the NVM cell 12, to refresh a diminished charge, for example. In alternative embodiments of the invention, the analog adjusting module 30 may be used for providing a signal, represented by path 34, for use in adjusting selected parameters elsewhere in the monitoring system 10 or externally, in a host system (not shown), for example. The adjusting module 30 shown is but a single example. Multiple adjusting modules may be used for adjusting the NVM cells, for example, adding bias to a floating gate to compensate for monitored conditions, or adding compensation to other points in the circuit, system, or associated host system. Similarly, adjusting modules may be deployed for calibration as well, for example calibrating for changes in environmental conditions such as increases in temperature, or radiation levels, and the like. It should also be noted that, in addition to providing a signal to the analog adjusting module 30, the control module 20 may also provide a similar signal 35 for use outside of the monitoring system 10. Preferably, a mux 37 may be used to provide a reference out 35, indicative of adjustments made to the NVM 12 as needed.

The monitoring system 10 may provide a system output 36 in many alternative or concurrent forms depending upon the needs of the particular application. For example, the system output 36 may be provided in the form of an indication of whether a particular NVM cell 12, or NVM array, is functioning within certain parameters. The system output 36 may provide an analog signal indicative of a particular value 24, e.g., voltage level, for the monitored NVM(s). A binary system output 36 may also be used, for example indicating pass/fail of a data retention check 22. The system output 36 may be used to initiate action to be taken in relation to a NVM cell 12, array, or with respect to the monitoring system itself 10, or a broader host system with which the NVM 12 and monitoring system 10 are associated. For example, the system output 36 may be used to provide an error message, to provide feedback useable by an associated system, or to initiate protective action, such as shut-down, to prevent damage by overvoltage or undervoltage conditions. Error reporting based on monitored conditions may be state-based, through a serial interface or pin, for example, or analog error reporting, which may be used for further triggering and monitoring management decisions, or for compensation or protection somewhere else in the circuit, system, or externally.

Preferably, the floating gate monitoring methods and apparatus use a small amount of power when operating in an "evaluation" state, and no power when standing by in an "normal" operating state. One preferred technique for achieving this conservation of power is to operate the reference(s) used for evaluation only as needed, and not during the normal operating state. In order to switch between states, a trigger module 38 is preferably used to trigger the evaluation module 14, initiating evaluation of the monitored NVM 12 when prompted by selected triggering events or conditions. Conversely, specific triggering events may also be used to place the NVM monitor in the normal operating state in response to particular events or conditions. Triggering events may include external events, such as time intervals supplied by an external source, such as an external clock in an associated system 40, for example. External events related to the NVM 12 or associated system may also be used to initiate monitoring. For instance, an external temperature sensor, or shock sensor, may be used to trigger monitoring based on changes in operating conditions. Triggering events may also include conditions determined by the monitoring system 10 during operation in an evaluation state, such as operating temperature changes, stresses, humidity, vibrations, acceleration/deceleration, motion, shock, electromagnetic radiation, and selected portions of the light spectrum, for example. Many variations are possible, including embodiments using combinations of triggering events, such as utilizing a temperature sensor trigger to commence steps for using a timed trigger when a particular temperature threshold is reached, or vice versa. Alternative implementations of the invention are possible, incorporating what are in effect variations of the evaluation state. Examples of preferred monitoring system evaluation state variations include the use of a failsafe or protective state responsive to potentially hazardous conditions, an "alert" state of heightened monitoring, or a continuous monitoring state. Additional alternative monitoring implementations may be adapted to meet various needs. A feature common to preferred embodiments of the invention is the shutting down of the monitoring system when not actively evaluating the monitored circuit.

Figure 2:
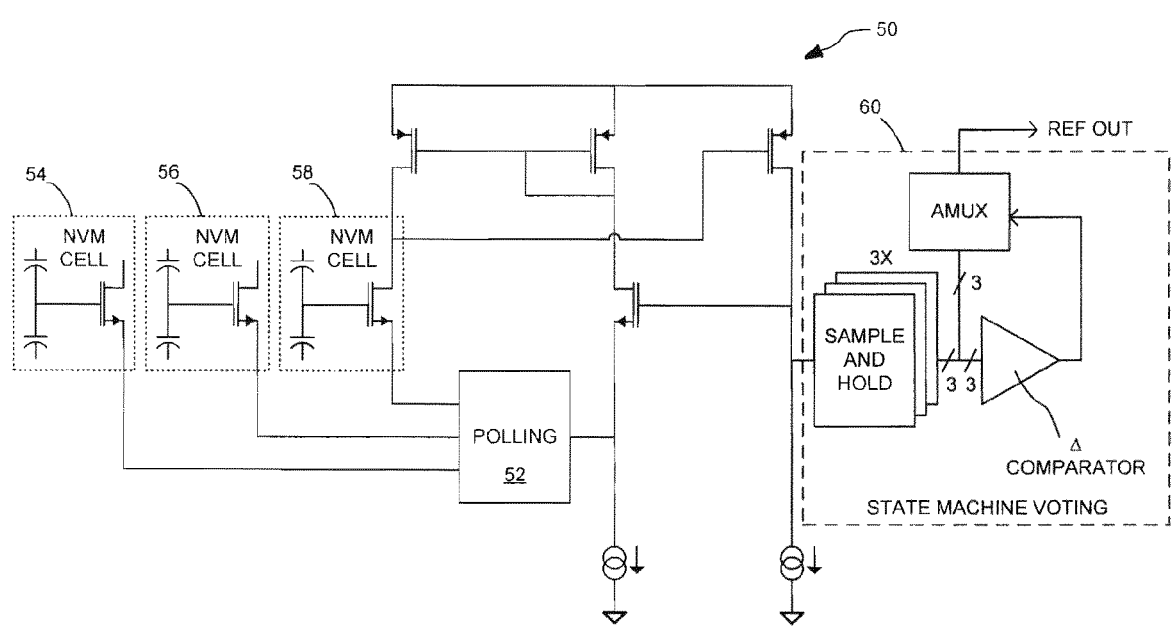
FIG. 2 is simplified schematic diagram of an example of a preferred alternative embodiment of non-volatile memory (NVM) monitoring circuits, systems, and methods.

Now referring primarily to FIG. 2, an example of a preferred embodiment of a monitoring system and method is shown. In the exemplary system 50, a polling device 52 is used to evaluate a number of NVM cells serving as references, e.g., 54, 56, 58. In this example, multiple NVM floating gate values, 54, 56, 58, are polled and compared to one another, and a polled evaluation signal output REF_OUT is provided based upon the polled majority determined by state voting machine 60. In this example, the NVM cells are cross-checked among one another in order to verify data integrity and reliability. The polling method shown and described may be used with selected NVM cells of a monitored NVM system, or dedicated NVM cells included within the monitoring system. In either case, the monitoring system does not use power when in the normal operating state, but only requires a minimal power input for initial programming and any reprogramming which may be required in the evaluation state. It should be appreciated by those skilled in the arts that the systems and methods introduced with reference to FIG. 2 may also be used with various triggering, feedback, and output techniques such as those described, alluded to, implied, or suggested with respect to FIG. 1. Thus, for example, the simplified system 50 of FIG. 2 may be adapted for use in an evaluation module 14 shown in the more complex system 10 of FIG. 1.

The methods and apparatus of the invention provide one or more advantages including but not limited to monitoring, speed, accuracy, offset compensation, and efficiency in programmable floating gate circuits. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A method for monitoring a floating gate circuit comprising the steps of:
   switching a monitor from a normal state to an evaluation state, whereby one or more electrical characteristic of one or more floating gate device is subsequently monitored;
   evaluating the one or more monitored electrical characteristic of the one or more floating gate device with respect to one or more reference, thereby producing one or more output signal; and then
   switching from the evaluation state to the normal state.

2. The method according to claim 1 further comprising one or more successive iterations of the evaluating step.

3. The method according to claim 1 wherein the step of switching a monitor from a normal state to an evaluation state further comprises using a trigger actuated by an external source.

4. The method according to claim 1 wherein the step of switching a monitor from a normal operating state to an evaluation state further comprises using a trigger actuated by a sensor.

5. The method according to claim 1 wherein the step of switching a monitor from a normal operating state to an evaluation state further comprises using a trigger actuated by a temperature sensor.

6. The method according to claim 1 wherein the step of switching a monitor from a normal operating state to an evaluation state further comprises using a trigger actuated by a moisture sensor.

7. The method according to claim 1 wherein the step of switching a monitor from a normal operating state to an evaluation state further comprises using a trigger actuated by a pressure sensor.

8. The method according to claim 1 wherein the step of switching a monitor from a normal operating state to an evaluation state further comprises using a trigger actuated by an electrical sensor.

9. The method according to claim 1 wherein the step of switching a monitor from a normal operating state to an evaluation state further comprises using a trigger actuated by an inertia sensor.

10. The method according to claim 1 wherein the step of switching a monitor from a normal operating state to an evaluation state further comprises using a trigger actuated by a particle sensor.

11. The method according to claim 1 wherein the step of switching a monitor from a normal operating state to an evaluation state further comprises using a trigger actuated by accepting a manual input.

12. The method according to claim 1 wherein the step of switching a monitor from a normal operating state to an evaluation state further comprises using a trigger actuated by a timer.

13. The method according to claim 1 wherein the step of switching a monitor from a normal operating state to an evaluation state further comprises using a trigger actuated by a timer, the timer actuated by a sensor.

14. The method according to claim 1 wherein the step of switching a monitor from a normal operating state to an evaluation state further comprises using a trigger actuated by a sensor, the sensor actuated by a timer.

15. The method according to claim 1 wherein the step of switching a monitor from a normal operating state to an evaluation state further comprises using a trigger actuated by a second sensor, the second sensor actuated by a first sensor.

16. The method according to claim 1 wherein the output signal further comprises an indication of the state of one or more non-volatile memory cell.

17. The method according to claim 1 wherein the output signal further comprises an analog value relating to a characteristic of one or more non-volatile memory cell.

18. The method according to claim 1 wherein the output signal further comprises a feedback signal for influencing the evaluating step.

19. The method according to claim 1 wherein the output signal further comprises a feedback signal for influencing one or more non-volatile memory cell value.

20. The method according to claim 1 wherein the output signal further comprises a feedback signal for influencing one or more electrical characteristic of the non-volatile memory circuit.

21. The method according to claim 1 wherein the output signal further comprises a feedback signal for influencing one or more electrical characteristic in a system associated with the non-volatile memory circuit.

22. The method according to claim 1 wherein the reference further comprises one or more floating gate charge.

23. The method according to claim 1 wherein the reference further comprises one or more band gap reference.

24. The method according to claim 1 wherein the reference further comprises one or more external signal.

25. A system for monitoring a non-volatile memory circuit comprising:
   an evaluation module operably coupled to the non-volatile memory circuit for reading one or more non-volatile memory cells, and for reading one or more reference, whereby an evaluation signal may be provided;
   a control module operably coupled for receiving the evaluation signal from the evaluation module, the control module configured for providing one or more output signal; and
   a trigger module operably coupled for switching the system between an evaluation state for monitoring the non-volatile memory circuit and a normal state.

26. The system according to claim 25 wherein the reference further comprises one or more floating gate having a stored charge.

27. The system according to claim 25 wherein the reference further comprises one or more band gap reference.

28. The system according to claim 25 wherein the reference further comprises one or more external signal.

29. The system according to claim 25 further comprising an adjusting module operably coupled to the control module for adjusting one or more electrical characteristics of the system.

30. The system according to claim 25 further comprising an adjusting module operably coupled for providing an adjusting charge to one or more non-volatile memory cells.

31. The system according to claim 25 wherein the evaluation module further comprises polling means for reading a plurality of non-volatile memory cells and for providing one or more polled evaluation signal to the control module.

* * * * *